(12) United States Patent
Wu et al.

(10) Patent No.: US 11,387,232 B2
(45) Date of Patent: Jul. 12, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Cheng-Han Wu, Hsinchu (TW); Chie-Iuan Lin, Hsinchu County (TW); Kuei-Ming Chang, New Taipei (TW); Rei-Jay Hsieh, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/628,728

(22) Filed: Jun. 21, 2017

(65) Prior Publication Data
US 2018/0277536 A1 Sep. 27, 2018

Related U.S. Application Data

(60) Provisional application No. 62/475,330, filed on Mar. 23, 2017.

(51) Int. Cl.
*H01L 29/78* (2006.01)
*H01L 27/092* (2006.01)
(Continued)

(52) U.S. Cl.
CPC .... *H01L 27/0886* (2013.01); *H01L 21/82345* (2013.01); *H01L 21/823431* (2013.01);
(Continued)

(58) Field of Classification Search
CPC ......... H01L 27/0886; H01L 21/823431; H01L 21/823437; H01L 21/823462; H01L 21/7685–76852; H01L 21/7834; H01L 21/66628; H01L 21/6656; H01L 21/66575; H01L 29/66545; H01L 29/7848; H01L 21/76224–76237; H01L 21/823481; H01L 21/823878; H01L 21/76216–76218; H01L 21/823418–823425; H01L 21/823814
See application file for complete search history.

(56) References Cited

U.S. PATENT DOCUMENTS 4,713,358 A * 12/1987 Bulat ................ H01L 21/28518
257/264
4,980,306 A * 12/1990 Shimbo ............. H01L 21/76224
257/E21.546
(Continued)

*Primary Examiner* — Mary A Wilczewski
*Assistant Examiner* — Tsz K Chiu
(74) *Attorney, Agent, or Firm* — McClure, Qualey & Rodack, LLP

(57) ABSTRACT

A semiconductor device includes a substrate; a first gate stack disposed on the substrate; a second gate stack disposed on the substrate, wherein a metal component of the first gate stack is different from a metal component of the second gate stack; and a dielectric structure disposed over the substrate and between the first gate stack and the second gate stack, in which the dielectric structure is separated from the first gate stack and the second gate stack, and a distance between the dielectric structure and the first gate stack is substantially equal to a distance between the dielectric structure and the second gate stack.

20 Claims, 11 Drawing Sheets

(51) Int. Cl.
*H01L 27/088* (2006.01)
*H01L 21/8234* (2006.01)
*H01L 29/66* (2006.01)
*H01L 21/8238* (2006.01)
*H01L 21/265* (2006.01)

(52) U.S. Cl.
CPC ........ *H01L 21/823437* (2013.01); *H01L 21/823462* (2013.01); *H01L 21/823481* (2013.01); *H01L 21/823821* (2013.01); *H01L 27/088* (2013.01); *H01L 27/0924* (2013.01); *H01L 29/66545* (2013.01); *H01L 21/26506* (2013.01); *H01L 29/7848* (2013.01)

(56) References Cited

U.S. PATENT DOCUMENTS

| | | | | |
|---|---|---|---|---|
| 5,110,749 | A * | 5/1992 | Ikeda | H01L 21/74 148/DIG. 10 |
| 5,494,851 | A * | 2/1996 | Lee | H01L 21/76216 438/450 |
| 6,281,555 | B1 * | 8/2001 | Yu | H01L 21/76237 257/374 |
| 6,624,497 | B2 * | 9/2003 | Beasom | H01L 21/74 257/370 |
| 7,071,531 | B2 * | 7/2006 | Rhodes | H01L 21/76237 257/292 |
| 9,362,383 | B1 * | 6/2016 | Balakrishnan | H01L 29/495 |
| 10,163,680 | B1 * | 12/2018 | Hu | H01L 21/76237 |
| 2004/0012022 | A1 * | 1/2004 | Wu | H01L 27/10811 257/68 |
| 2004/0094784 | A1 * | 5/2004 | Rhodes | H01L 27/1463 257/291 |
| 2004/0178430 | A1 * | 9/2004 | Rhodes | H01L 21/76224 257/292 |
| 2005/0285203 | A1 * | 12/2005 | Fukutome | H01L 29/045 257/368 |
| 2006/0017115 | A1 * | 1/2006 | Tu | H01L 27/10861 257/371 |
| 2006/0219867 | A1 * | 10/2006 | Yamaguchi | H01L 27/1463 250/208.1 |
| 2013/0280871 | A1 * | 10/2013 | Hyun | H01L 21/823807 438/217 |
| 2014/0273368 | A1 * | 9/2014 | Hung | H01L 29/6656 438/230 |
| 2019/0027603 | A1 * | 1/2019 | Cheng | H01L 29/0653 |
| 2019/0371933 | A1 * | 12/2019 | Chen | H01L 23/5283 |

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/475,330, filed Mar. 23, 2017, which is herein incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
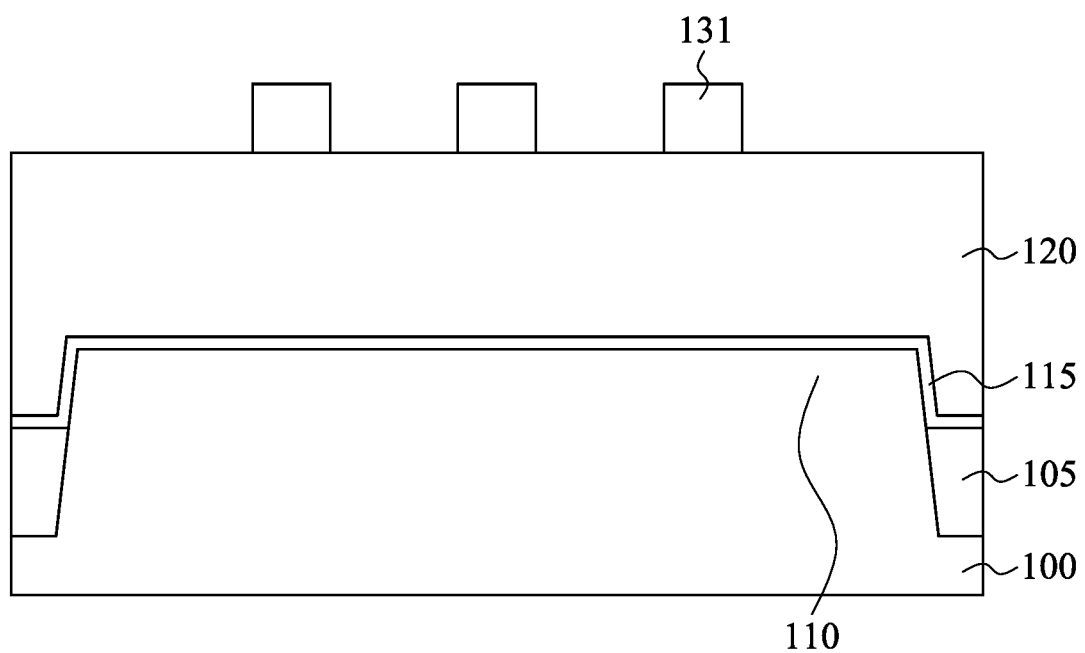
FIGS. 1A to 1M are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIGS. 1A to 1M are cross-sectional views of a method for manufacturing a semiconductor device at various stages in accordance with some embodiments of the present disclosure.

Reference is made to FIG. 1A. A substrate 100 is provided. The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

Some exemplary substrate 100 also includes an insulator layer. The insulator layer includes suitable materials, including silicon oxide, sapphire, and/or combinations thereof. An exemplary insulator layer may be a buried oxide layer (BOX). The insulator is formed by one or more suitable process(es), such as implantation (e.g., SIMOX), oxidation, deposition, and/or other suitable process. In some exemplary semiconductor substrate 100, the insulator layer is a component (e.g., layer) of a silicon-on-insulator substrate.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

In some embodiments, the substrate 100 also includes a fin structure 110. The fin structure 110 may be patterned by any suitable method. For example, the fin structure 110 may be patterned using one or more photolithography processes, including double-patterning or multi-patterning processes.

Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structure 110.

A plurality of isolation structures 105 are formed on the substrate 100 and adjacent to the fin structure 110. The isolation structures 105, which act as a shallow trench isolation (STI) around the fin structure 110 may be formed by chemical vapor deposition (CVD) techniques using tetra-ethyl-ortho-silicate (TEOS) and oxygen as a precursor. In yet some other embodiments, the isolation structures 105 are insulator layers of a SOI wafer.

A gate dielectric 115, a dummy gate material layer 120, and a mask layer 131 are deposited sequentially on a substrate 100 by, for example, low pressure CVD (LPCVD) and plasma enhanced (PECVD).

A photo resist pattern (not shown) is coated on the mask layer 131 and is exposed and developed to form a desire pattern. The mask layer 131 is dry etched (such as plasma etching) in turn with the photo resist pattern as a mask, until the dummy gate material layer 120 is exposed. As a result, the patterned mask layer 131 is formed. The plasma etching gas may include gas containing halogen, for example, fluoro-gases such as fluorocarbon gas ($C_xH_yF_z$), $NF_3$, $SF_6$, or other halogen-containing gases such as $Cl_2$, $Br_2$, HBr, HCl, or it may include oxidants such as oxygen, ozone and oxynitride. In some embodiments, after etching, wet cleaning is performing with de-ionized water and the like or dry cleaning is performing with oxygen, fluorinated gas and the like to completely remove the resultant of etching.

The gate dielectric 115 may be formed by thermal oxidation, chemical vapor deposition, sputtering, or other methods known and used in the art for forming a gate dielectric. The gate dielectric 115 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

The dummy gate material layer 120 may include materials having different etching selectivity from the materials of the mask layer 131, such as polycrystalline silicon, amorphous silicon and/or microcrystal silicon. The mask layer 131, which is used as a hard mask layer during etching later, may include silicon oxide, silicon nitride and/or silicon oxynitride. In some embodiments, the dummy gate material layer 120 may include polycrystalline-silicon (poly-Si) or polycrystalline silicon-germanium (poly-SiGe). Further, the dummy gate material layer 120 may be doped poly-silicon with uniform or non-uniform doping.

The mask layer 131, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof.

Figure 1B:
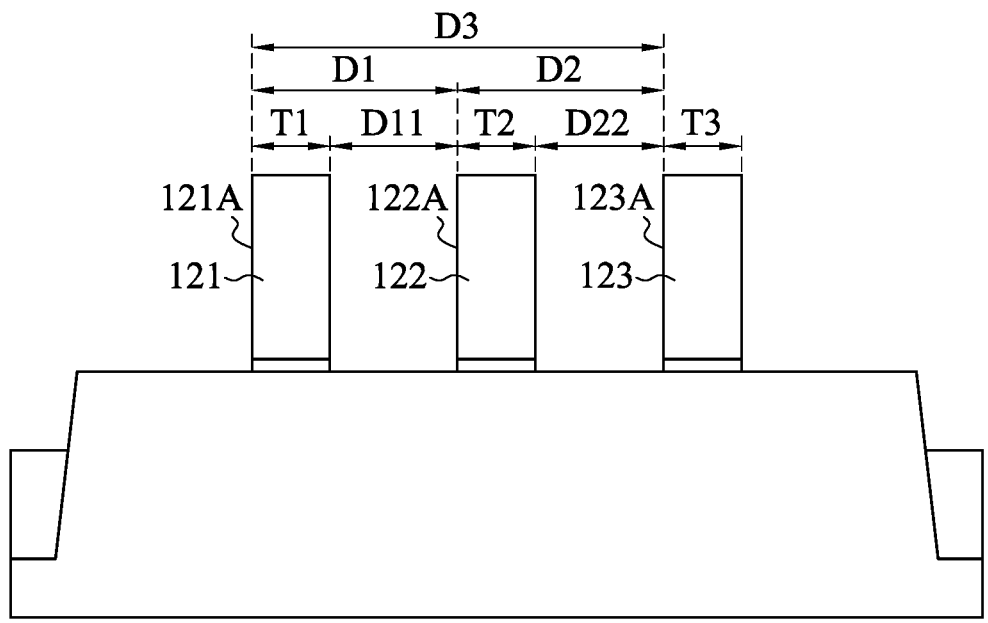

Reference is made to FIG. 1B. A removing (or etch) process is then performed to remove portions other than the intended pattern of the dummy gate material layer 120 (see FIG. 1A) and the gate dielectric 115 to form a plurality of dummy gates 121, 122, and 123. The dummy gate 121 is adjacent to the dummy gate 122, and the dummy gate 122 is adjacent to the dummy gate 123, in which the dummy gate 122 is between the dummy gates 121 and 123. The dummy gates 121, 122, and 123 have gate lengths T1, T2, and T3, respectively, in which the gate lengths T1, T2, and T3 are substantially the same. That is, the dummy gates 121, 122, and 123 have substantially the same profiles (or shapes). The gate length T1, T2, and T3 are parallel to the direction extending from, for example, the dummy gate 121 to the dummy gate 122. A distance D1 between a first side 121A of the dummy gate 121 and the first side 122A of the dummy gate 122 is substantially equal to a distance D2 between a first side 122A of the dummy gate 122 and the first side 123A of the dummy gate 123. In other words, the distance D1 (or D2) is substantially equal to half of a distance D3 between a first side 121A of the dummy gate 121 and the first side 123A of the dummy gate 123. The distances D1 and D2 may also be referred to as gate pitches. From another perspective, a distance D11 between the dummy gates 121 and 122 is substantially equal to a distance D22 between the dummy gates 122 and 123. The term "substantially" as used herein may be applied to modify any quantitative representation which could permissibly vary without resulting in a change in the basic function to which it is related.

In some embodiments, the dummy gate material layer 120 and the gate dielectric 115 (see FIG. 1A) may be patterned by an etching process, such as a dry plasma etching process or a wet etching process. At least one parameter, such as etchant, etching temperature, etching solution concentration, etching pressure, source power, radio frequency (RF) bias voltage, etchant flow rate, of the patterning (or etching) recipe can be tuned. For example, the same or similar dry etching process used for etching the patterned mask layer 131 (see FIG. 1A), such as plasma etching, may be used to etch the dummy gate material layer 120 and the gate dielectric 115 until the fin structure 110 is exposed.

Figure 1C:
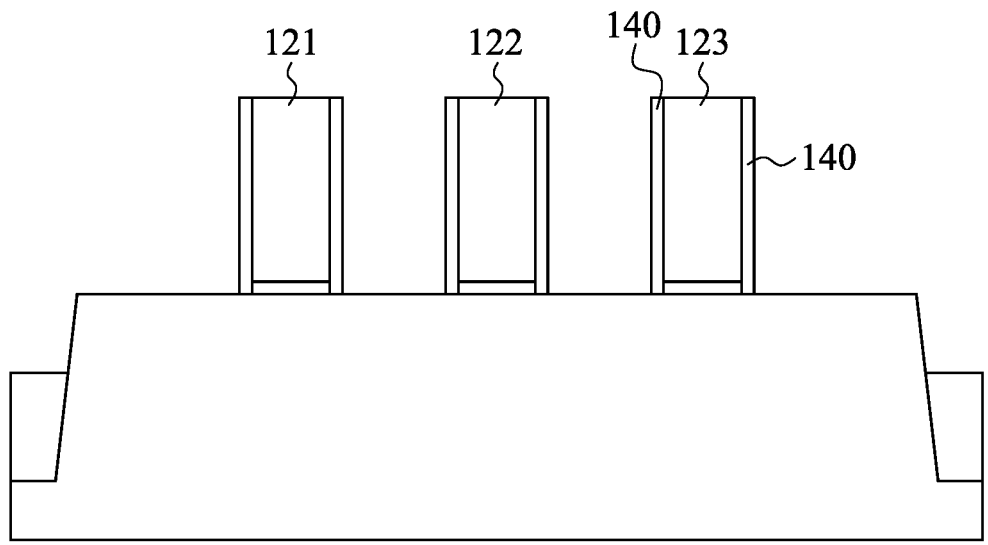

Reference is made to FIG. 1C. A plurality of gate spacers 140 are formed respectively on opposite sidewalls of the dummy gates 121, 122, and 123, the gate dielectric 115, and the mask layer 130. In some embodiments, at least one of the gate spacers 140 includes single or multiple layers. The gate spacers 140 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other methods known in the art. The gate spacers 140 may include different materials with different etch characteristics than the dummy gates 121, 122, and 123 so that the gate spacers 140 may be used as masks for the patterning of the dummy gates 121. The gate spacers 140 may then be patterned, such as by one or more etch(es) to remove the portions of the gate spacers 140 from the horizontal surfaces of the structure.

Figure 1D:
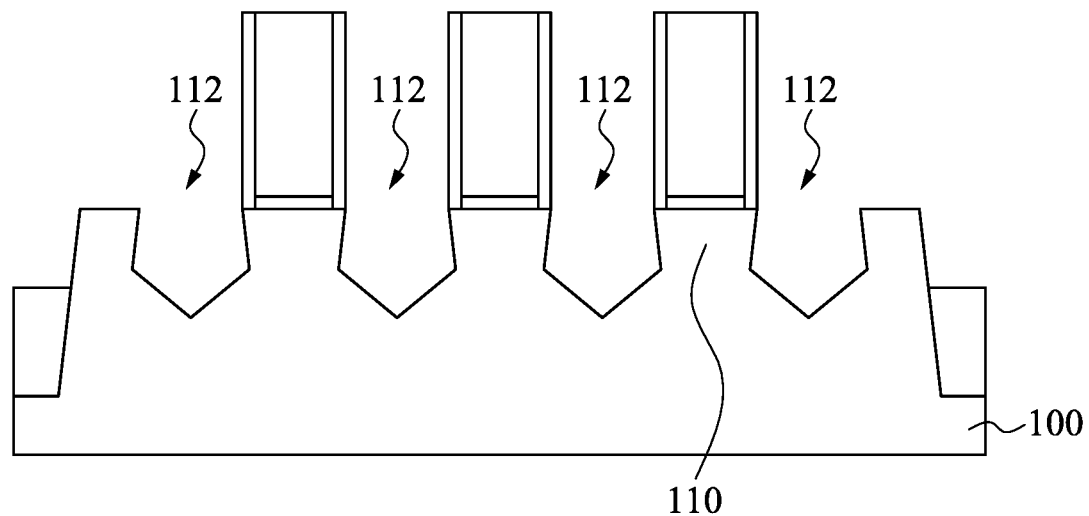

Reference is made to FIG. 1D. One or more recessing process(es) is(are) performed to the substrate 100 to form a plurality of recesses 112 in the fin structure 110 of the substrate 100. The fin structure 110 of the substrate 100 may be recessed by suitable process including dry etching process, wet etching process, and/or combination thereof. The recessing process may also include a selective wet etch or a selective dry etch. A wet etching solution includes a tetramethylammonium hydroxide (TMAH), a $HF/HNO_3$/

CH₃COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH4OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 1E:
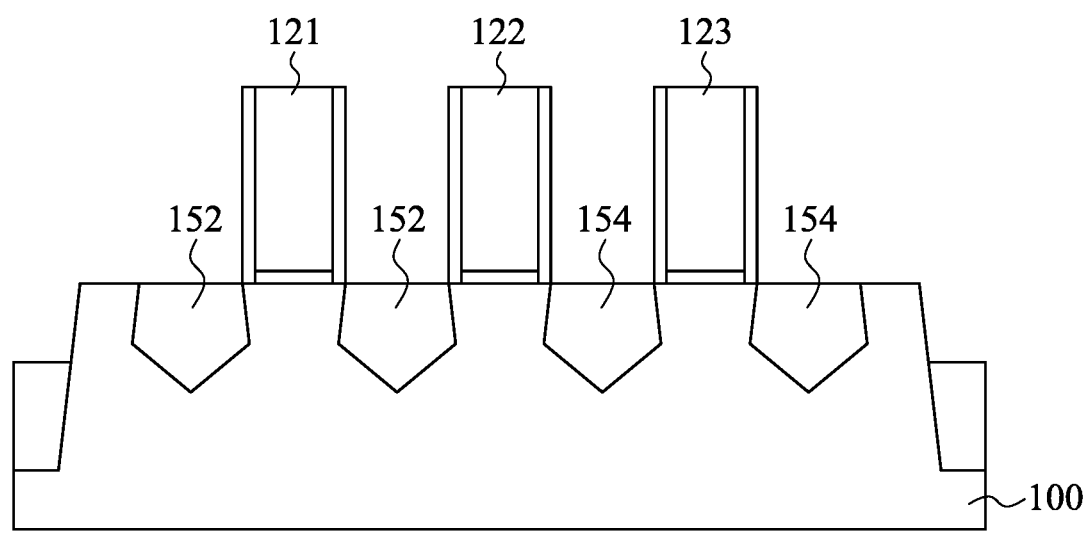

Reference is made to FIG. 1E. A plurality of source/drain features 152 and 154 are respectively formed over the substrate 100 and in the recesses 112 (shown in FIG. 1D). In greater details, the source/drain features 152 are formed in the first region 182 of the substrate 100, and the source/drain features 154 are formed in the third region 186 of the substrate 100. At least one of the source/drain features 152 is formed between the dummy gates 121 and 122, and at least one of the source/drain features 154 is formed between the dummy gates 122 and 123.

In some embodiments, the source/drain features 152 and 154 may be epitaxy structures, and may also be referred to as epitaxy structures 152 and 154. The source/drain features 152 and 154 may be formed using one or more epitaxy or epitaxial (epi) processes, such that Si features, SiGe features, and/or other suitable features can be formed in a crystalline state on the fin structure 110. In some embodiments, lattice constants of the source/drain features 152 and 154 are different from lattice constants of the fin structure 110, and the source/drain features 152 and 154 are strained or stressed to enable carrier mobility of the semiconductor device and enhance the device performance. The source/drain features 152 and 154 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, for a NMOS transistor, the source/drain features 152 and 154 may include SiP, SiC, SiPC, Si, III-V compound semiconductor materials, or combinations thereof for the n-type epitaxy structure. During the formation of the n-type epitaxy structure, n-type impurities such as phosphorous or arsenic may be doped with the proceeding of the epitaxy. For example, when the source/drain features 152 and 154 include SiC or Si, n-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 110 (e.g., silicon). Thus, a strained channel can be achieved to increase carrier mobility and enhance device performance. The source/drain features 152 and 154 may be in-situ doped. If the source/drain features 152 and 154 are not in-situ doped, a second implantation process (i.e., a junction implant process) is performed to dope the source/drain features 152 and 154. One or more annealing processes may be performed to activate the source/drain features 152 and 154. The annealing processes include rapid thermal annealing (RTA) and/or laser annealing processes.

Figure 1F:
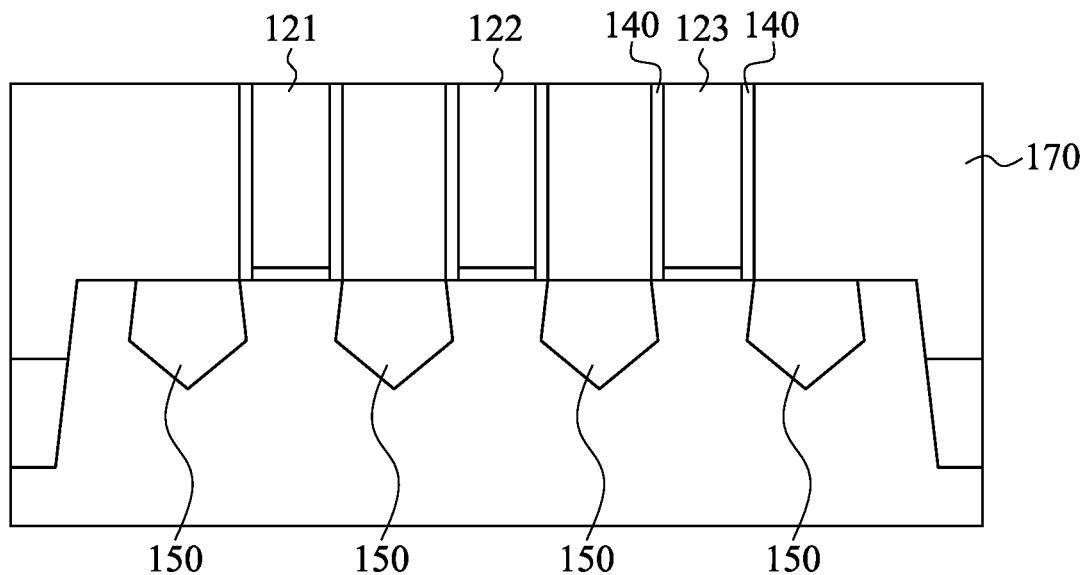

Reference is made to FIG. 1F. After the source/drain features 152 and 154 are formed, an interlayer dielectric 170 is formed over the substrate 100 and at outer sides of the gate spacers 140. Accordingly, the interlayer dielectric 170 covers the source/drain features 152 and 154 and portions of the fin structure 110 of the substrate 100. The interlayer dielectric 170 may include silicon oxide, oxynitride or other suitable materials. The interlayer dielectric 170 includes a single layer or multiple layers. The interlayer dielectric 170 can be formed by a suitable technique, such as CVD or ALD. A chemical mechanical planarization (CMP) process may be applied to remove excessive interlayer dielectric 170. After the chemical mechanical planarization (CMP) process, the dummy gates 121, 122, and 123 are exposed from the interlayer dielectric 170.

Figure 1G:
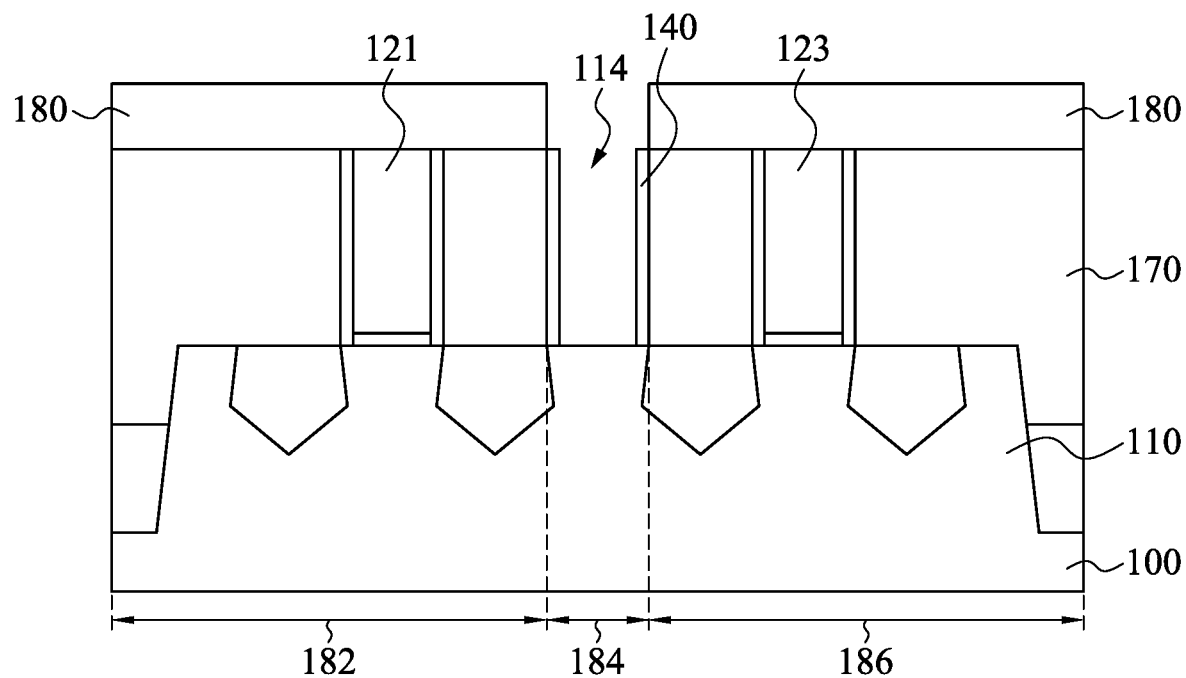

Reference is made to FIG. 1G. A patterned hard mask (HM) 180 is formed over the fin structure 110 of the substrate 100. In some embodiments, the hard mask 180 is formed over the interlayer dielectric 170 and the dummy gates 121 and 123 to define a first region 182, a second region 184, and a third region 186. The hard mask 180 covers the first region 182 and the third region 186 and leaves the second region 184 being uncovered. In other words, the hard mask 180 exposes the dummy gate 122 (see FIG. 1F) in the second region 184, and the dummy gates 121 and 123 may be protected by the hard mask 180 during process(es) performed later.

The dummy gate 122 is removed to from a recess 114 in the second region 184. The recess 114 exposes portions of the fin structure 110 of the substrate 100 in the second region 184. In some embodiments, the dummy gate 122 is removed by a selective etch process, including a selective wet etch or a selective dry etch, and carries vertical profile of the gate spacers 140. With the selective etch process, the recess 114 is formed with a self-alignment nature, which relaxes process constrains, such as misalignment, and/or overlay issue in lithograph process, recess profile controlling in etch process, pattern loading effect, and etch process window.

Figure 1H:
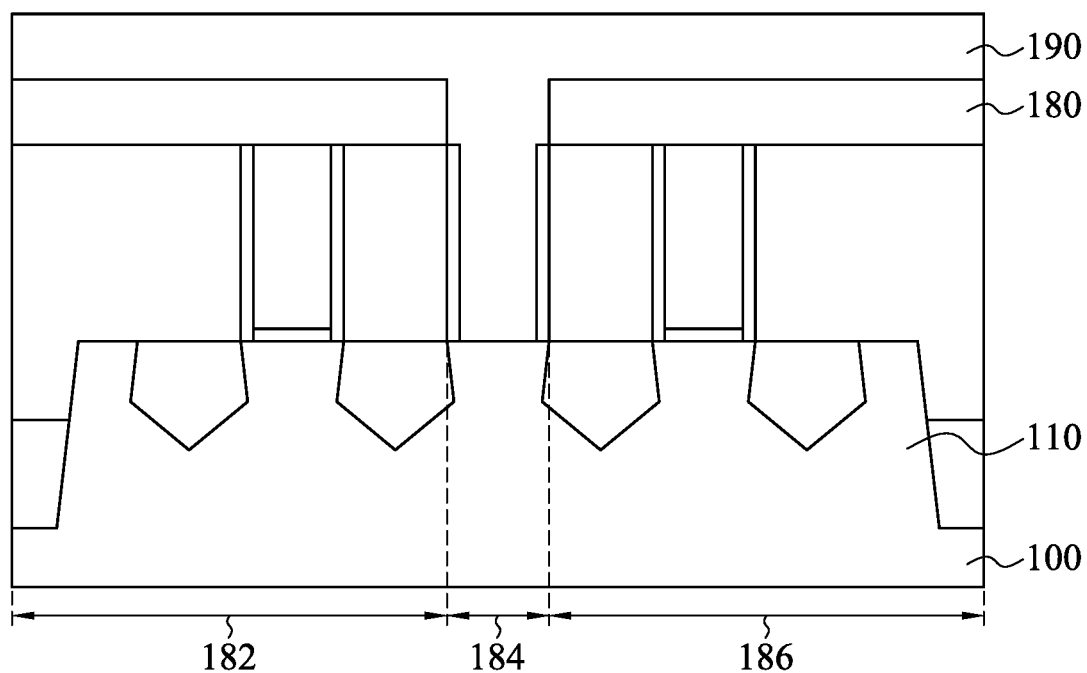
Figure 1I:
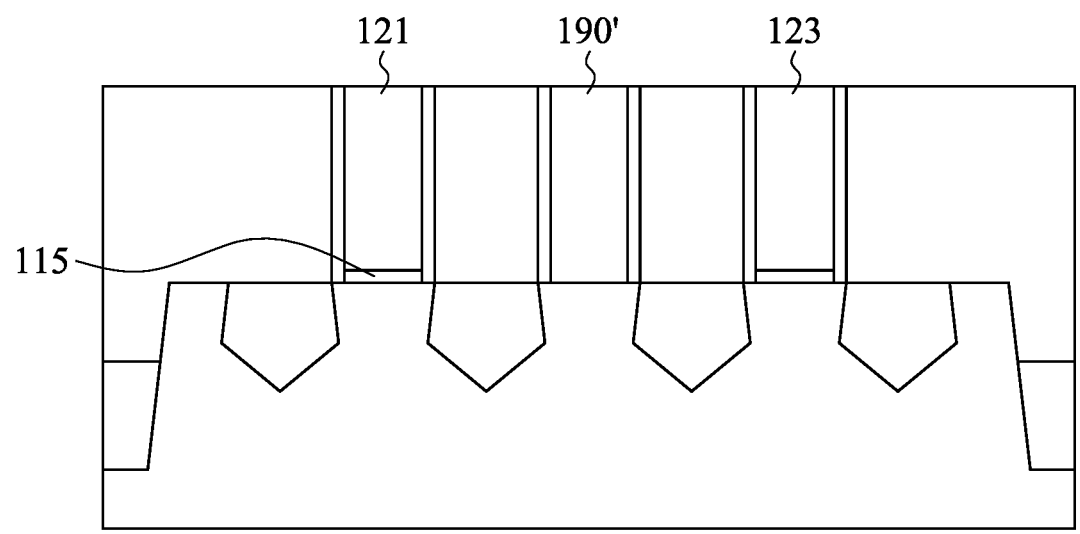

Reference is made to FIG. 1H. A dielectric layer 190 is formed over the fin structure 110 of the substrate 100 and filling the recess 114 shown in FIG. 1G. In some embodiments, the dielectric layer 190 may include $SiO_2$, SiON, $Si_3N_4$, SiOCN, or combinations thereof. The dielectric layer 190 may be formed by a suitable technique, such as CVD, ALD and spin-on coating. Reference is made to FIG. 1I. A chemical mechanical planarization (CMP) process is performed to the dielectric layer 190 including the mask layer 180 shown in FIG. 1H to remove the excessive dielectric layer 190 and planarize the top surface of the second dielectric layer 190 with the dummy gates 121 and 123. After the CMP process, a dielectric structure 190' is formed. In other words, the dummy gate 122 (see FIG. 1F) is replaced by the dielectric structure 190'.

Figure 1J:
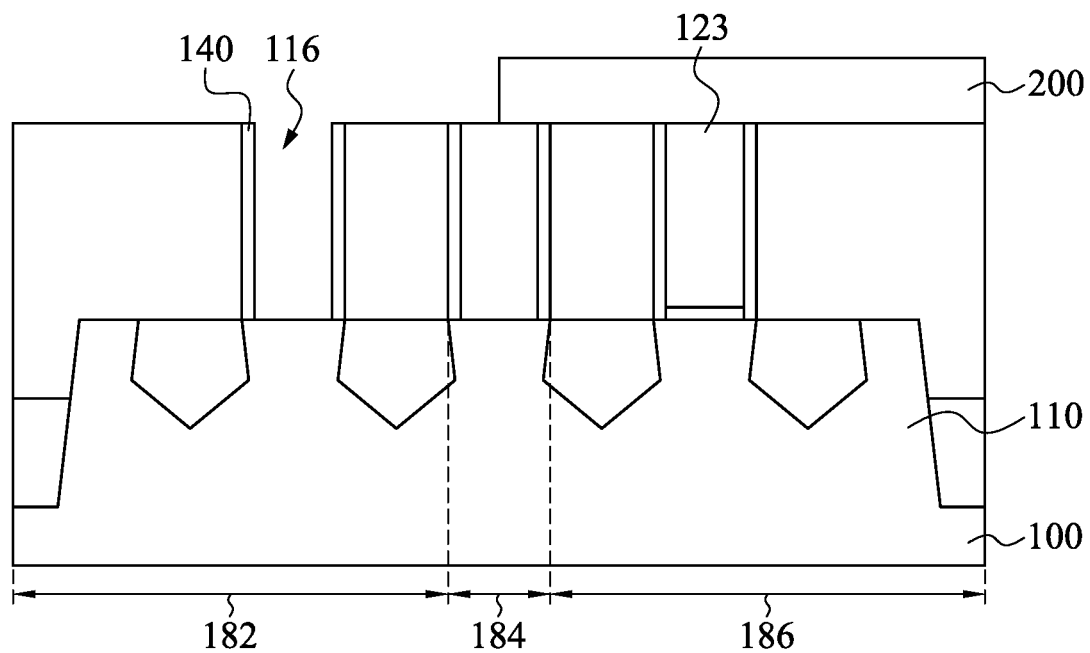

Reference is made to FIG. 1J. A mask layer 200 is formed over the fin structure 110 of the substrate 100. The mask layer 200 is formed over the third region 186 and covers the dummy gate 123 to protect the dummy gate 123 during process(es) performed later. In other words, the dummy gate 121 (see FIG. 1I) in the first region 182 is exposed from the mask layer 200.

A replacement gate (RPG) process scheme is employed. In some embodiments, in a RPG process scheme, a dummy gate is formed first and is replaced later by a metal gate after high thermal budget processes are performed. Accordingly, the dummy gate 121 (see FIG. 1I) and the gate dielectric 115 are removed to from a recess 116 in the first region 182. The recess 116 exposes portions of the fin structures 110 of the substrate 100 in the first region 182. In some embodiments, the dummy gate 121 and the gate dielectric 115 are removed by a selective etch process, including a selective wet etch or a selective dry etch, and carries vertical profile of the gate spacers 140.

Figure 1K:
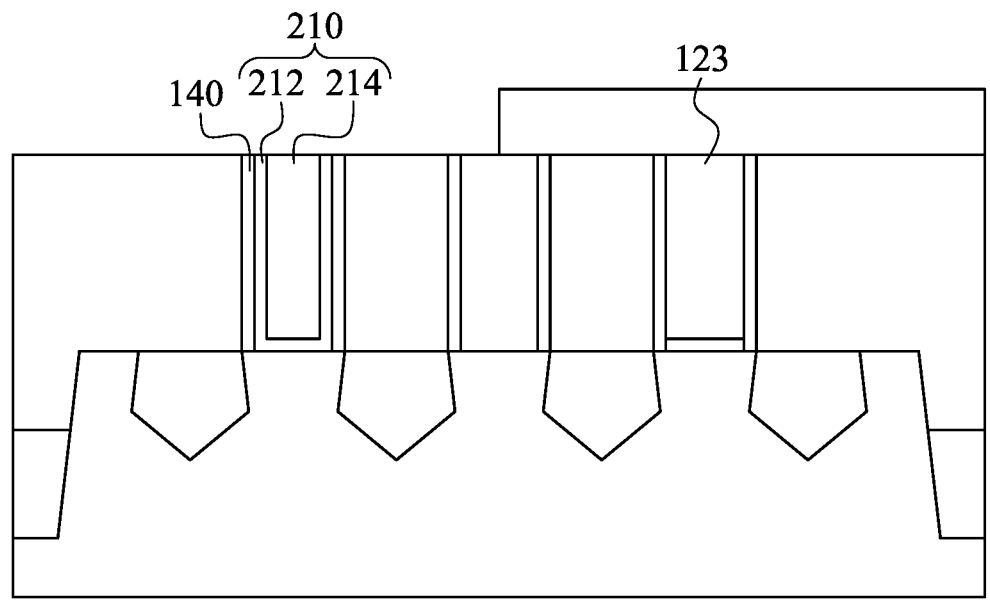

Reference is made to FIG. 1K. A first gate stack 210 is formed in the recess 116 shown in FIG. 1J. In other words, the dummy gate 121 and the gate dielectric 115 (see FIG. 1I) are replaced by the first gate stack 210. The first gate stack 210 includes an interfacial layer (not shown), a gate dielectric 212 formed over the interfacial layer, and a gate metal 214 formed over the gate dielectric 212. The gate dielectric 212, as used and described herein, includes dielectric materials having a high dielectric constant, for example, greater than that of thermal silicon oxide (~3.9). The gate metal 214 may include a metal, metal alloy, and/or metal silicide.

In some embodiments, the gate metal 214 included in the first gate stack 210 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). For example, the gate metal 214 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the first gate stack 210 formed is a p-type metal gate including a p-type work function layer. In some embodiments, the capping layer included in the first gate stack 210 may include refractory metals and their nitrides (e.g. TiN, TaN, W2N, TiSiN, TaSiN). The cap layer may be deposited by PVD, CVD, Metal-organic chemical vapor deposition (MOCVD) and ALD. In some embodiments, the fill layer included in the first gate stack 210 may include tungsten (W). The metal layer may be deposited by ALD, PVD, CVD, or other suitable process.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectric 212 may include a high-K dielectric layer such as hafnium oxide ($HfO_2$). Alternatively, the gate dielectric 212 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric 212 may be formed by ALD, PVD, CVD, oxidation, and/or other suitable methods.

Figure 1L:
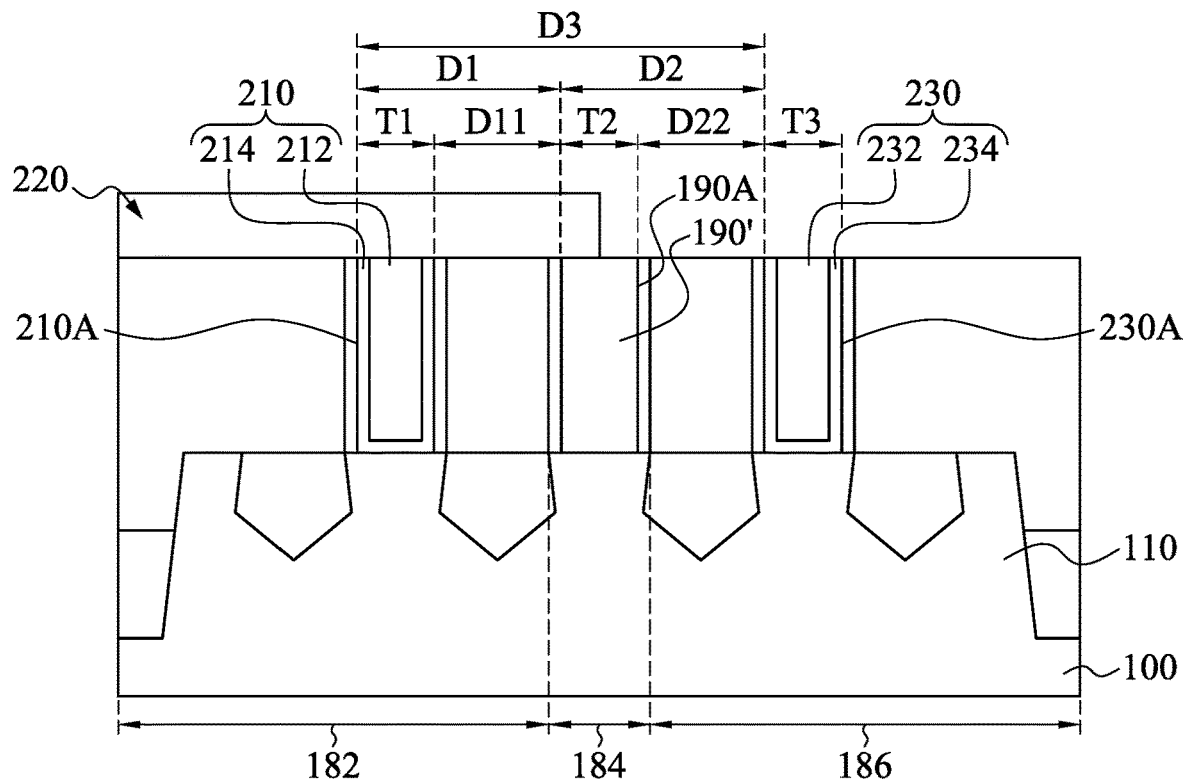

Reference is made to FIG. 1L. After the first gate stack 210 is formed, the mask layer 200 (see FIG. 1K) is removed. Another mask layer 220 is formed over the fin structure 110 of the substrate 100. The mask layer 220 is formed over the first region 182 and covers the first gate stack 210 to protect the first gate stack 210 during process(es) performed later. In other words, the dummy gate 123 (see FIG. 1K) in the third region 186 is exposed from the mask layer 220.

A replacement gate (RPG) process scheme is employed to the dummy gate 123 (see FIG. 1K). Some relevant details of the replacement gate (RPG) process are similar to the processes described in FIG. 1J to 1K, and, therefore, a description in this regard will not be repeated. After the replacement gate process, a second gate stack 230 is formed. In other words, the dummy gate 123 is replaced by the second gate stack 230. Similar to the first gate stack 210, the second gate stack 230 includes an interfacial layer (not shown), a gate dielectric 232 formed over the interfacial layer, and a gate metal 234 formed over the gate dielectric 232. The first gate stack 210 and the second gate stack 230 are active gates, and may also be referred to as first active gate 210 and the second first active gate 230.

The gate metal 234 of the second gate stack 230 is different from the gate metal 214 of the first gate stack 210 to define different threshold voltage (VT) region. That is, a metal component of the first gate stack 210 is different from a metal component of the second gate stack 230. As a result, the first region 182 and the third region 186 may also be referred to as a first VT region 182 and a second VT region 186, respectively. Moreover, the dielectric structure 190' may act as an isolation structure to separated different VT regions. Accordingly, the second region 184 may be referred to as an isolation region 184, and the dielectric structure 190' may also be referred to as an isolation structure 190'.

Reference is made to FIGS. 1B and 1L. The dummy gates 121, 122, and 123 are replaced respectively by the first gate stack 210, the dielectric structure 190, and the second gate stack 230. The first gate stack 210, the dielectric structure 190, and the second gate stack 230 are separated from each other.

Since the dummy gates 121, 122, and 123 have substantially the same profiles, the first gate stack 210, the dielectric structure 190, and the second gate stack 230 accordingly have substantially the same profiles (or shapes). As a result, the length T2 of the dielectric structure 190' is substantially equal to the gate lengths T1 and T3 of the first gate stack 210 and the second gate stack 230. A distance D1 between a first side 210A of the first gate stack 210 and the first side 190A of the dielectric structure 190' is substantially equal to a distance D2 between a first side 190A of the dielectric structure 190' and the first side 230A of the second gate stack 230. In other words, the distance D1 (or D2) is substantially equal to half of a distance D3 between a first side 210A of the first gate stack 210 and the first side 230A of the second gate stack 230. The distances D1 and D2 may also be referred to as gate pitches. From another perspective, a distance D11 between the first gate stack 210 and the dielectric structure 190' is substantially equal to a distance D22 between the dielectric structure 190' and the second gate stack 230.

Figure 1M:
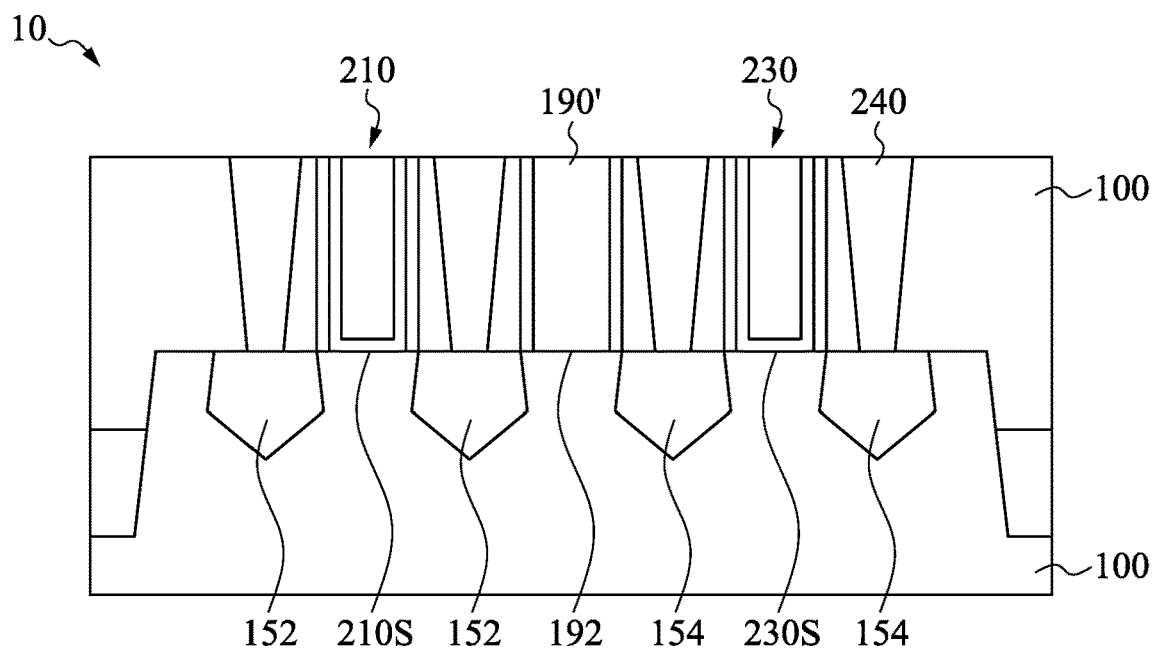

Reference is made to FIG. 1M. A plurality of conductive features 240 are formed in the interlayer dielectric 170 to form a semiconductor device 10. The conductive features 240 may be formed by recessed the interlayer dielectric 170 to form a plurality of openings (not shown) that expose the source/drain features 152 and 154. Metal such as tungsten is then deposited into the openings down to the source/drain features 152 and 154 to form conductive features 240 (not shown) in the interlayer dielectric 170.

At least one of the source/drain features 152 is disposed over the substrate 100 and between the first gate stack 210 and the dielectric structure 190', and at least one of the source/drain features 154 is disposed over the substrate 100 and between the second gate stack 230 and the dielectric structure 190'. Moreover, a bottom surface 210S of the first gate stack 210, a bottom surface 230S of the second gate stack 230, and a bottom surface 192 of the dielectric structure 190' are substantially coplanar.

Figure 2A:
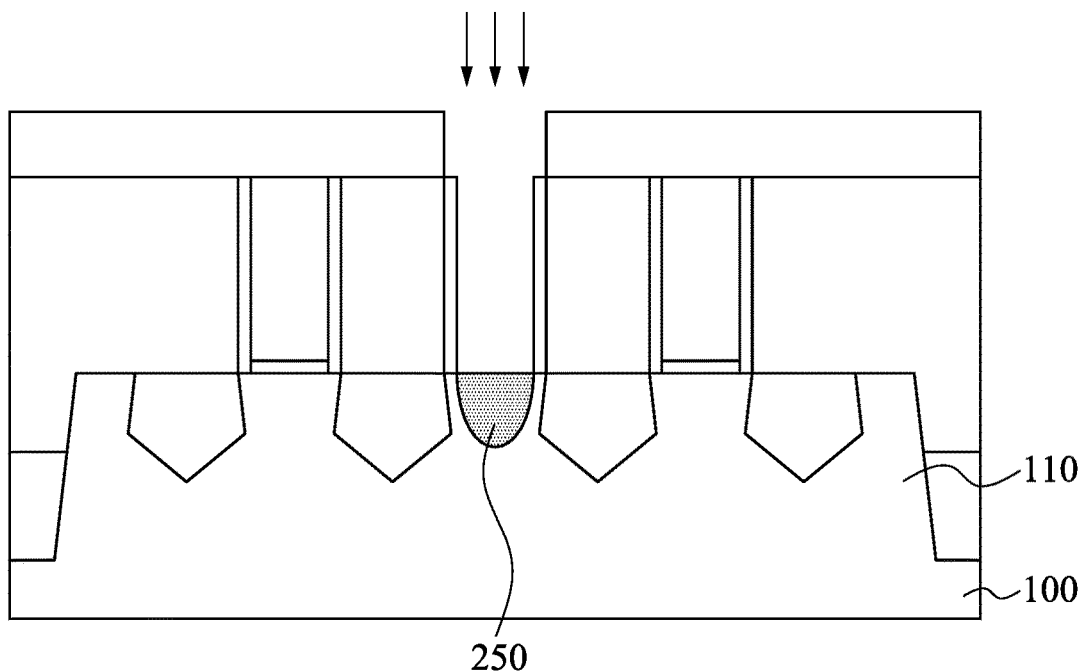
FIGS. 2A to 2B are cross-sectional views of a method for manufacturing a semiconductor device at various stages in accordance with some embodiments of the present disclosure.
Figure 2B:
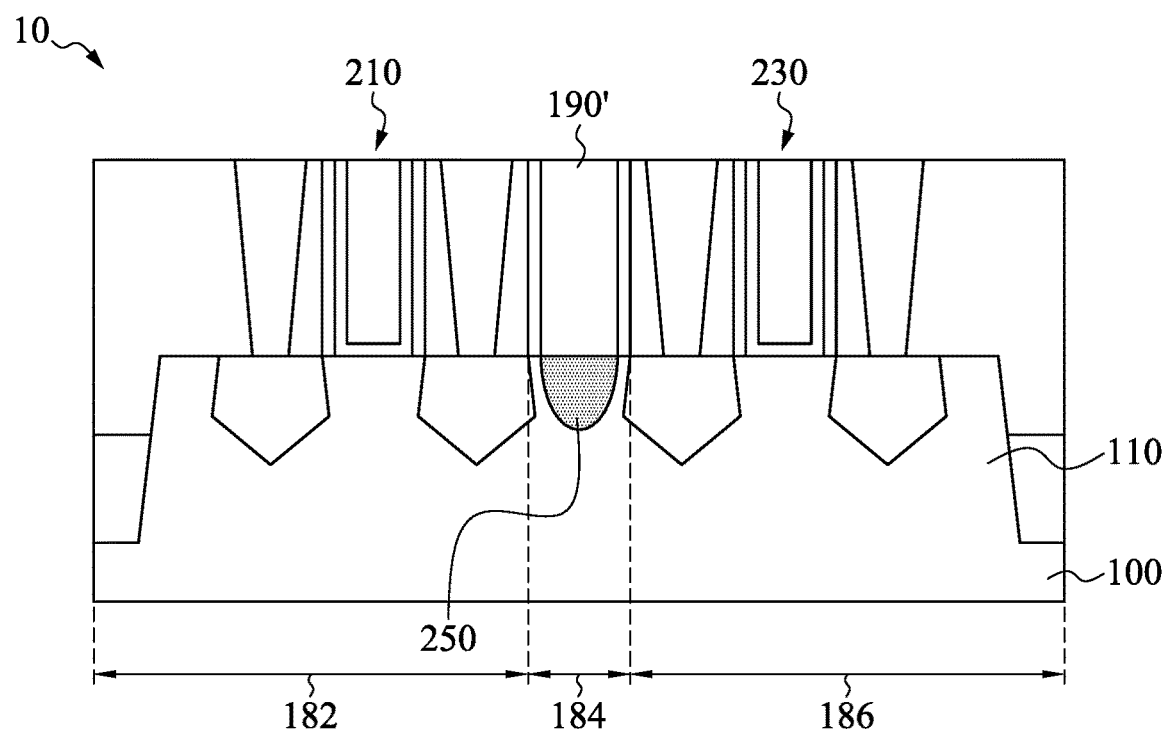

FIGS. 2A to 2B are cross-sectional views of a method for manufacturing a semiconductor device at various stages in accordance with some embodiments of the present disclosure.

Reference is made to FIG. 2A. After the dummy gate 122 (see FIG. 1F) is removed, as described in FIG. 1G, an implantation process is then performed to the exposed portions of the fin structure 110 of the substrate 100. Thus, an implantation region 250 is formed in the fin structure 110. In some embodiments, the implanted ions of the implantation process may be, but not limited to, carbon, nitrogen, or oxygen. In some other embodiments, in the case of a p-type substrate 100 with p-wells, n-type ions such as phosphorous (P), arsenic (As) or antimony (Sb) may be implanted in the substrate 100. Similarly, in the case of an n-type substrate 100 with n-wells, p-type ions such as boron (B) may be implanted in the substrate 100.

Reference is made to FIG. 2B. Accordingly, the implantation region 250 is formed in the fin structure 110 of the substrate 100, and disposed under the dielectric structure 190'. The implantation region 250 is in contact with the dielectric structure 190'. Also the dummy gate 121 and 123 in FIG. 2A are replaced by gate stacks 210 and 230, respectively. The implantation region 250 and the dielectric structure 190' are disposed in an isolation region 184 of the substrate 100, and may be collectively act as an isolation structure to isolate a first region 182 having a first gate stack 210 and a second VT region 186 having a second gate stack 230. In some embodiments, the first gate stack 210 and the second gate stack 230 have different metal components, as described in FIG. 1L. Other relevant structural details of the semiconductor device 10 of FIG. 2B are similar to the semiconductor device 10 of FIG. 1M, and, therefore, a description in this regard will not be repeated hereinafter.

Figure 3A:
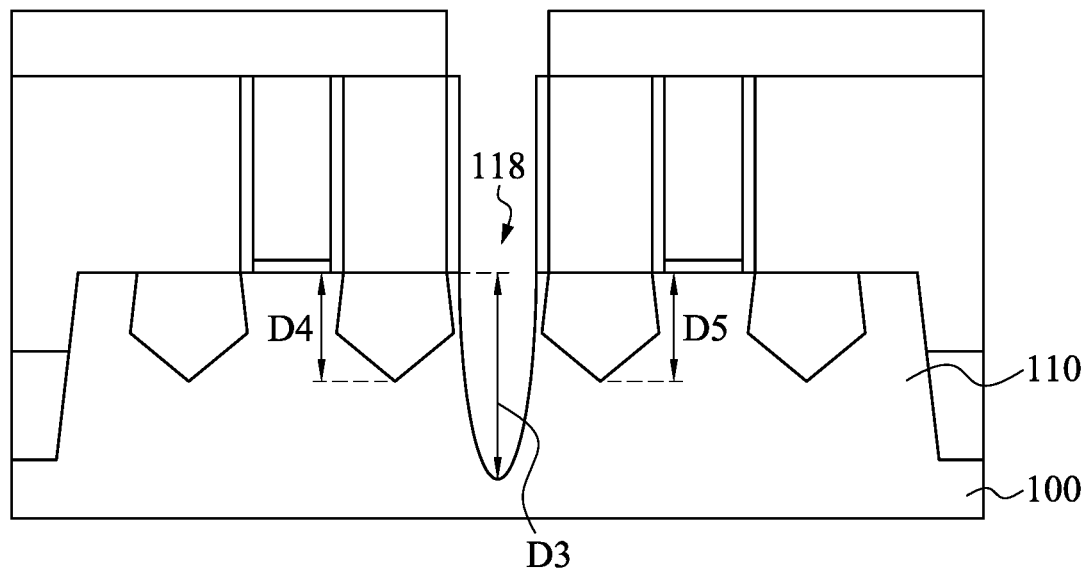
FIGS. 3A to 3C are cross-sectional views of a method for manufacturing a semiconductor device at various stages in accordance with some embodiments of the present disclosure.
Figure 3B:
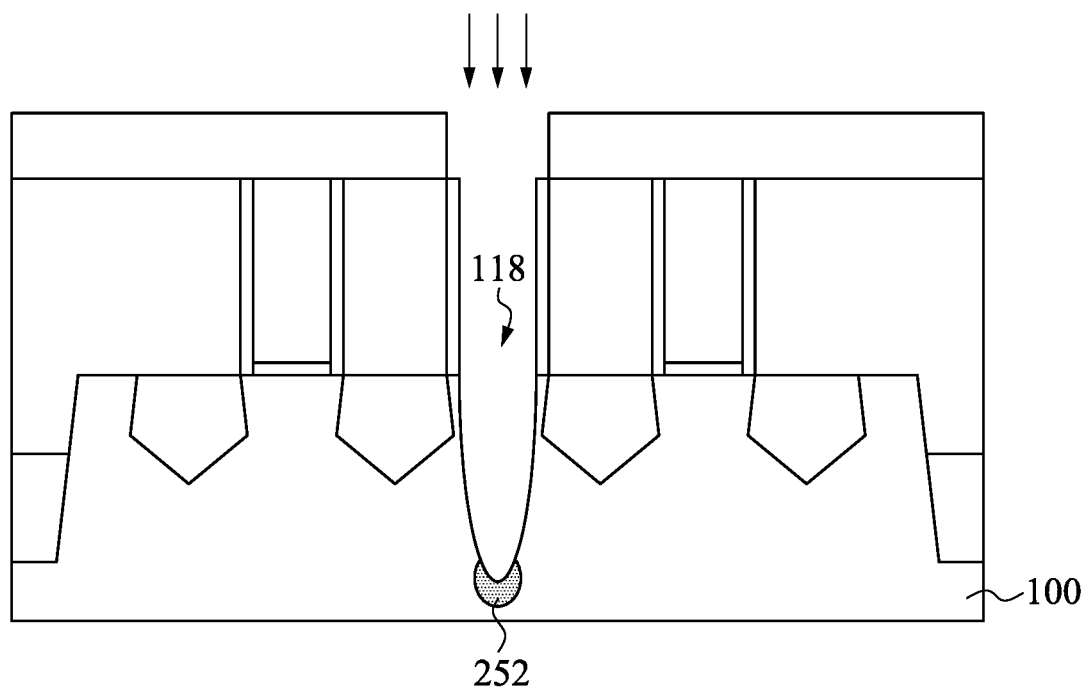

FIGS. 3A to 3B are cross-sectional views of a method for manufacturing a semiconductor device at various stages in accordance with some embodiments of the present disclosure.

Reference is made to FIG. 3A. After the dummy gate 122 (see FIG. 1F) is removed, as described in FIG. 1G, a recessing process is performed to the exposed portions of the fin structure 110 of the substrate 100 to form a recess 118 in the fin structure 110 of the substrate 100. In some embodiments, the recess 118 may be tuned such that a depth D3 of the recess 118 in the substrate 100 is larger than a depth D4 of the epitaxy structures 152 and a depth D5 of the epitaxy structures 154. That is, the recess 118 is formed deeper than the epitaxy structures 152 and 154. However, in some other embodiments, the depth D3 may be smaller or substantially equal to the depth D4 and the depth D5.

Reference is made to FIG. 3B. An implantation process is performed to the exposed portions of the substrate 100 through the recess 118. Thus, an implantation region 252 is formed in the substrate 100. The implantation region 252 is similar to the implantation region 250 described in FIG. 2B, and similar details are omitted for simplicity. In some embodiments, a surface passivation process, an annealing process, or combinations thereof may also be performed to the substrate 100.

Figure 3C:
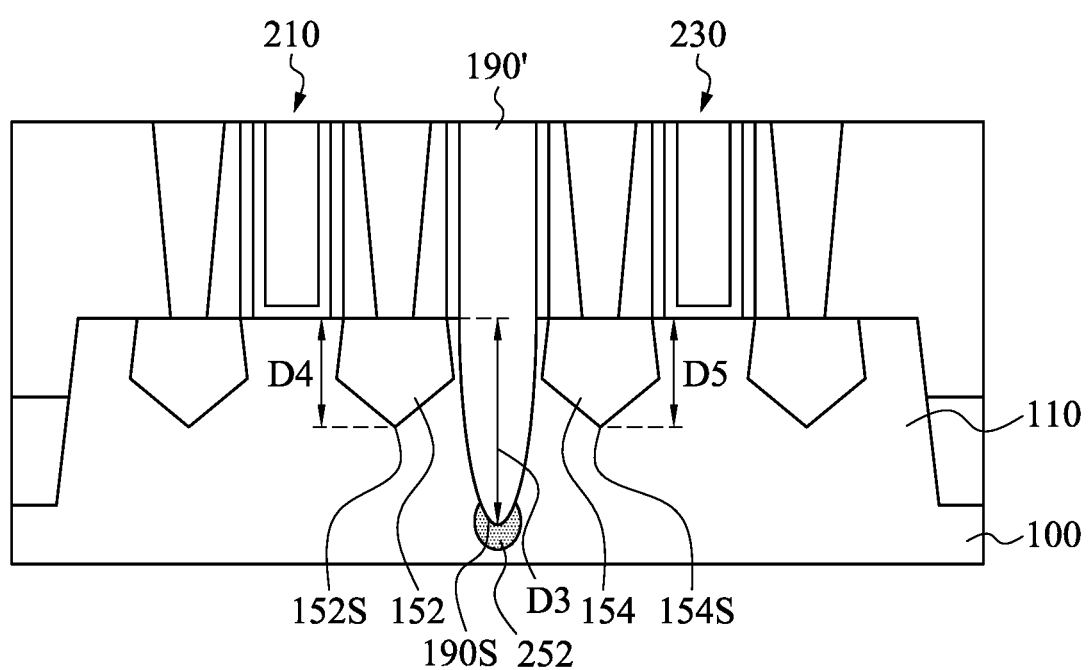

Reference is made to FIG. 3C. A dielectric structure 190' is formed over the substrate 100 and filling the recess 118 (see FIG. 3B). Also the dummy gate 121 and 123 in FIG. 3B are replaced by gate stacks 210 and 230, respectively. That is, the dielectric structure 190' is embedded in the substrate 100 (or the fin structure 110), and between the first gate stack 210 and the second gate stack 230. The implantation region 250 is disposed under a dielectric structure 190'. In greater details, the implantation region 250 is in contact with the dielectric structure 190'. The dielectric structure 190' has a depth D3' in the substrate 100, in which the depth D3' is larger than the depth D4 of the epitaxy structures 152 and the depth D5 of the epitaxy structures 154. That is, the dielectric structure 190' is formed deeper than the epitaxy structures 152 and 154. From other perspective, a bottom surface 190S of the dielectric structure 190' is lower than a bottom surface 152S of the epitaxy structures 152 and a bottom surface 154S of the epitaxy structures 154. However, in some other embodiments, the bottom surface 190S may be higher or substantially equal to the bottom surface 152S and the bottom surface 154S.

Figure 4:
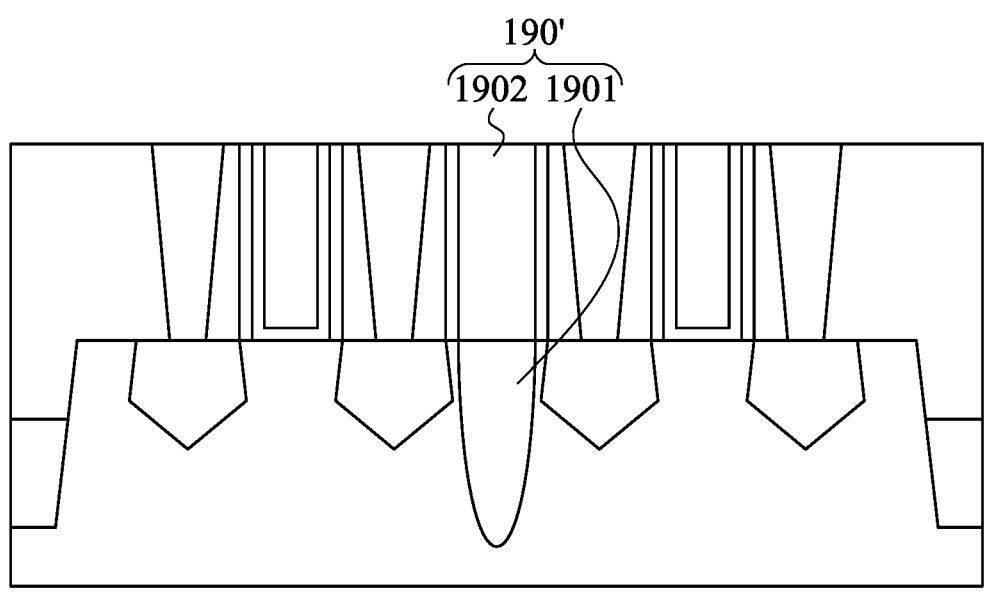
FIG. 4 is cross-sectional view of a semiconductor device in accordance with some embodiments of the present disclosure.

FIG. 4 is cross-sectional view of a semiconductor device in accordance with some embodiments of the present disclosure. A dielectric structure 190' may include a first dielectric 1901 and a second dielectric 1902 disposed on the first dielectric 1901. The first dielectric 1901 and a second dielectric 1902 may be made from different materials, and may be made from $SiO_2$, SiON, $Si_3N_4$, SiOCN, or combinations thereof. The dielectric structure 190' of FIG. 4 may be made by, for example, forming the first dielectric 1901 in a recess 118 in a fin structure 110 of a substrate 100, and forming the second dielectric 1902 over the first dielectric 1901. In some other embodiments, the dielectric structure 190' may be multi-layer structures including more than three dielectric layers.

According to the aforementioned embodiments, a dummy gate is replaced by a dielectric structure to isolate at least two gate stacks having different metal components. The formation of the dielectric structure may reduce the device scale, such as a distance between two active gates. With this configuration, the performance of the semiconductor device can be improved.

According to some embodiments, a semiconductor device includes a substrate; a first gate stack disposed on the substrate; a second gate stack disposed on the substrate, wherein a metal component of the first gate stack is different from a metal component of the second gate stack; and a dielectric structure disposed over the substrate and between the first gate stack and the second gate stack, in which the dielectric structure is separated from the first gate stack and the second gate stack, and a distance between the dielectric structure and the first gate stack is substantially equal to a distance between the dielectric structure and the second gate stack.

According to some embodiments, a semiconductor device includes a substrate comprising a fin structure; a first active gate over the fin structure; a second active gate over the fin structure, wherein a metal component of the first active gate is different from a metal component of the second active gate; and a dielectric structure over the fin structure and between the first active gate and the second active gate, in which the first active gate, the second active gate, and the dielectric structure have substantially the same lengths.

According to some embodiments, a method for manufacturing a semiconductor device includes forming a first dummy gate, a second dummy gate, and a third dummy gate over a substrate, in which the third dummy gate is formed between the first dummy gate and the second dummy gate; replacing the third dummy gate with a dielectric structure; replacing the first dummy gate with a first gate stack; and replacing the second dummy gate with a second gate stack, in which a metal component of the first gate stack is different from a metal component of the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a semiconductor fin;
    a first gate stack disposed on the semiconductor fin;
    a second gate stack disposed on the semiconductor fin, wherein a metal component of the first gate stack is different from a metal component of the second gate stack;
    a dielectric structure disposed over the semiconductor fin and between the first gate stack and the second gate stack, wherein the dielectric structure has opposite first and second sidewalls respectively adjacent the first gate stack and the second gate stack, and a distance between the first sidewall of the dielectric structure and a sidewall of the first gate stack is substantially equal to a distance between the second sidewall of the dielectric structure and a sidewall of the second gate stack, and wherein the substrate comprises an implantation region under the dielectric structure, the implantation region contacts the dielectric structure, and forms a U-shape interface with a surface of the dielectric structure, and wherein the implantation region terminates prior to reaching a topmost surface of the substrate;
    a plurality of spacers on the first and second sidewalls of the dielectric structure;
    first and second source/drain features in the semiconductor fin, wherein the dielectric structure has a portion extending above the first and second source/drain features and non-overlapping the first and second source/drain features, wherein the first gate stack and the dielectric structure are respectively on opposite sides of the first source/drain feature, and the first source/drain feature is spaced from the dielectric structure;
    first and second conductive features over the semiconductor fin, the first conductive feature being between the first gate stack and the dielectric structure, and the second conductive feature being between the second gate stack and the dielectric structure, wherein the first source/drain feature is below the first conductive feature and the second source/drain feature is below the second conductive feature; and
    an interlayer dielectric over a sidewall of the dielectric structure.

2. The semiconductor device of claim 1, wherein the dielectric structure is made from $SiO_2$, SiON, $Si_3N_4$, SiOCN, or combinations thereof.

3. The semiconductor device of claim 1, wherein a length of the dielectric structure is substantially equal to a gate length of the first gate stack.

4. The semiconductor device of claim 1, wherein a bottom surface of the dielectric structure is lower than a bottom surface of the source/drain feature.

5. The semiconductor device of claim 1, wherein a shape of the first gate stack, a shape of the second gate stack, and a shape of the dielectric structure are substantially the same.

6. The semiconductor device of claim 1, wherein the dielectric structure has a portion above a top surface of the substrate, and the portion of the dielectric structure, the first gate stack, and the second gate stack have substantially the same width.

7. A semiconductor device, comprising:
    a substrate comprising a fin structure;
    a first active gate over the fin structure;
    a second active gate over the fin structure, wherein a metal component of the first active gate is different from a metal component of the second active gate;
    a dielectric structure over the fin structure and between the first active gate and the second active gate, wherein the dielectric structure has a portion extending above a top surface of the fin structure, and a distance between opposite sidewalls of the first active gate is substantially the same as a distance between opposite sidewalls of the portion of the dielectric structure, and wherein the substrate comprises an implantation region under the dielectric structure, and the implantation region contacting the dielectric structure and form a U-shape interface with a surface of the dielectric structure;
    a plurality of spacers on opposite sidewalls of the dielectric structure and spaced from the first and second active gates, wherein the dielectric structure extends downwardly along sidewalls of the spacers to past interfaces between the spacers and the fin structure into the fin structure; and
    a plurality of first and second source/drain features in the fin structure, the first source/drain feature being between the first active gate and the dielectric structure, and the second source/drain feature being between the second active gate and the dielectric structure, wherein the dielectric structure has a portion extending above the first and second source/drain features and non-overlapping the first and second source/drain features; and
    an interlayer dielectric over a sidewall of the dielectric structure.

8. The semiconductor device of claim 7, wherein a distance between a first side of the first active gate and a first side of the dielectric structure is substantially equal to half of a distance between the first side of the first active gate and a first side of the second active gate.

9. The semiconductor device of claim 7, wherein the dielectric structure is embedded in the fin structure.

10. The semiconductor device of claim 9, wherein a bottom surface of the dielectric structure is lower than a bottom surface of the first source/drain feature.

11. The semiconductor device of claim 7, further comprising an interlayer dielectric, wherein the spacers are spaced from the first and second active gates by the interlayer dielectric.

12. The semiconductor device of claim 7, wherein the dielectric structure extends from the sidewalls of the spacers to a surface of the fin structure.

13. The semiconductor device of claim 7, wherein the implantation region terminates prior to reaching a topmost surface of the fin structure.

14. The semiconductor device of claim 7, wherein a bottom surface of the dielectric structure is lower than bottom surfaces of the plurality of spacers.

15. A semiconductor device, comprising:
    a substrate having a semiconductor fin;

a first active gate stack and a second active gate stack over the semiconductor fin, wherein the first active gate stack and the second active gate stack have different threshold voltage;

an isolation structure over the semiconductor fin and between the first active gate stack and the second active gate stack, wherein the isolation structure is made of a dielectric material, and wherein the substrate comprises an implantation region under the isolation structure, and the implantation region contacting the isolation structure and form a U-shape interface with a surface of the isolation structure;

a plurality of gate spacers disposed on sidewalls of the first active gate stack, sidewalls of the second active gate stack, and sidewalls of the isolation structure;

a plurality of first and second source/drain features in the semiconductor fin, the first source/drain feature being between the first active gate stack and the isolation structure, and the second source/drain feature being between the second active gate stack and the isolation structure, wherein the isolation structure has a portion extending above the first and second source/drain features and non-overlapping the first and second source/drain features; and an interlayer dielectric over a sidewall of the isolation structure.

16. The semiconductor device of claim 15, wherein the isolation structure extends into the semiconductor fin.

17. The semiconductor device of claim 16, wherein the isolation structure comprises an upper portion and a lower portion under the upper portion, and the upper portion and the lower portion are made of different materials.

18. The semiconductor device of claim 15, wherein a distance between the first active gate stack and the isolation structure is substantially the same as a distance between the second active gate stack and the isolation structure.

19. The semiconductor device of claim 15, wherein the dielectric material is a silicon-containing material.

20. The semiconductor device of claim 15, wherein the isolation structure has a portion above a top surface of the semiconductor fin, and the portion of the isolation structure, the first active gate stack, and the second active gate stack have substantially the same width.

* * * * *